(12) United States Patent
Garibay et al.

(10) Patent No.: US 11,193,953 B2
(45) Date of Patent: Dec. 7, 2021

(54) 3D CHIP TESTING THROUGH MICRO-C4 INTERFACE

(71) Applicant: International Business Machines Corporation, Armonk, NY (US)

(72) Inventors: Victor A. Garibay, Leander, TX (US); Chetan Mehta, Austin, TX (US); Doorlabh Panjwani, Karnataka (IN); Tingdong Zhou, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 8 days.

(21) Appl. No.: 16/409,277

(22) Filed: May 10, 2019

(65) Prior Publication Data
US 2019/0265273 A1    Aug. 29, 2019

Related U.S. Application Data

(62) Division of application No. 15/671,738, filed on Aug. 8, 2017, now Pat. No. 10,371,717, which is a division
(Continued)

(51) Int. Cl.
*G01R 1/067* (2006.01)
*H01L 23/00* (2006.01)
(Continued)

(52) U.S. Cl.
CPC ......... *G01R 1/067* (2013.01); *G01R 1/06738* (2013.01); *G01R 1/07378* (2013.01);
(Continued)

(58) Field of Classification Search
CPC . H01L 24/17; H01L 2924/2064; G01R 1/067; G01R 1/06738; G01R 1/073; G01R 1/07378; G01R 31/2601; G01R 31/318513
See application file for complete search history.

(56) References Cited

U.S. PATENT DOCUMENTS 6,641,406 B1    11/2003    Yatskov et al.
6,830,463 B2    12/2004    Keller
(Continued)

FOREIGN PATENT DOCUMENTS

WO    WO2012140810 A1    10/2012

OTHER PUBLICATIONS

Au et al., "Thru Silicon Via Stacking & Numerical Characterization for Multi-Die Interconnections using Full Array & Very Fine Pitch Micro C4 Bumps", 2011 Electronic Components and Technology Conference, 978-1-61284-498-5/11 2011 IEEE, pp. 296-303.
(Continued)

*Primary Examiner* — Son T Le
*Assistant Examiner* — Adam S Clarke
(74) *Attorney, Agent, or Firm* — Scully, Scott, Murphy & Presser, PC; Nathan Rau, Esq.

(57) ABSTRACT

Structures and methods for directly testing a semiconductor wafer having micro-solder connections. According to one embodiment, a method forms a pattern of micro-solder connections coupled with a through substrate via (TSV) that can be directly tested by electrical probing, without the use of a testing interposer. According to another embodiment, a method tests the pattern of micro-solder connections. According to another embodiment, a novel electrical probe tip structure has contacts on the same pitch as the pattern of micro-solder connections.

2 Claims, 15 Drawing Sheets

Related U.S. Application Data of application No. 14/148,779, filed on Jan. 7, 2014, now Pat. No. 9,726,691.

(51) Int. Cl.

| | | |
|---|---|---|
| *H01L 25/065* | (2006.01) | |
| *G01R 1/073* | (2006.01) | |
| *G01R 31/3185* | (2006.01) | |
| *H01L 21/66* | (2006.01) | |
| *G01R 31/26* | (2020.01) | |
| *H01L 23/48* | (2006.01) | |

(52) U.S. Cl.
CPC ...... *G01R 31/318513* (2013.01); *H01L 24/11* (2013.01); *H01L 24/13* (2013.01); *H01L 25/0657* (2013.01); *G01R 1/073* (2013.01); *G01R 31/2601* (2013.01); *H01L 22/14* (2013.01); *H01L 22/30* (2013.01); *H01L 22/32* (2013.01); *H01L 22/34* (2013.01); *H01L 23/481* (2013.01); *H01L 2224/13014* (2013.01); *H01L 2224/13016* (2013.01); *H01L 2224/13025* (2013.01); *H01L 2224/16145* (2013.01); *H01L 2224/16225* (2013.01); *H01L 2225/06513* (2013.01); *H01L 2225/06541* (2013.01); *H01L 2225/06596* (2013.01); *H01L 2924/14* (2013.01); *H01L 2924/15311* (2013.01); *H01L 2924/2064* (2013.01); *H01L 2924/20641* (2013.01)

(56) References Cited

U.S. PATENT DOCUMENTS

| | | | |
|---|---|---|---|
| 7,302,757 | B2 | 12/2007 | Brody et al. |
| 7,605,460 | B1 | 10/2009 | Wu et al. |
| 7,733,102 | B2 | 6/2010 | Cheng |
| 8,033,012 | B2 | 10/2011 | Hsu et al. |
| 8,062,968 | B1 | 11/2011 | Conn |
| 8,237,274 | B1 | 8/2012 | Rahman |
| 8,338,945 | B2 | 12/2012 | Yu et al. |
| 8,527,577 | B2 | 9/2013 | Lu et al. |
| 8,907,488 | B2 | 12/2014 | Ooi et al. |
| 9,030,222 | B2 | 5/2015 | Eldridge et al. |
| 9,217,758 | B2 | 12/2015 | Torreiter et al. |
| 9,322,848 | B2 | 4/2016 | Torreiter et al. |
| 9,349,697 | B2 | 5/2016 | Ooi et al. |
| 9,678,142 | B2 | 6/2017 | Rychaert et al. |
| 9,754,847 | B2 | 9/2017 | Wang et al. |
| 9,817,029 | B2 | 11/2017 | Wang et al. |
| 2001/0051396 | A1* | 12/2001 | Iwahashi ............ H01L 24/81 438/120 |
| 2002/0031868 | A1* | 3/2002 | Capote ............ H01L 24/29 438/126 |
| 2002/0050832 | A1* | 5/2002 | Aldaz ............ G01R 1/07342 324/750.25 |
| 2003/0080764 | A1* | 5/2003 | Zhou ............ G01R 1/07314 324/750.25 |
| 2003/0143872 | A1 | 7/2003 | Keller |
| 2003/0218246 | A1 | 11/2003 | Abe et al. |
| 2005/0221635 | A1 | 10/2005 | Brody et al. |
| 2006/0060845 | A1 | 3/2006 | Ramanuja et al. |
| 2007/0182019 | A1 | 8/2007 | Nishimura |
| 2009/0115071 | A1 | 5/2009 | Karashima et al. |
| 2011/0204357 | A1 | 8/2011 | Izuha |
| 2011/0294265 | A1 | 12/2011 | Shioga et al. |
| 2012/0136596 | A1 | 5/2012 | Yamaoka et al. |
| 2012/0138925 | A1 | 6/2012 | Oh |
| 2012/0206160 | A1 | 8/2012 | Wu et al. |
| 2012/0273782 | A1 | 11/2012 | Goel et al. |
| 2012/0286814 | A1 | 11/2012 | Wang et al. |
| 2012/0329295 | A1 | 12/2012 | Chey et al. |
| 2013/0037802 | A1 | 2/2013 | England et al. |
| 2013/0106244 | A1 | 5/2013 | Liu et al. |
| 2013/0147505 | A1* | 6/2013 | Wang ............ G01R 1/07342 324/755.01 |
| 2013/0171749 | A1 | 7/2013 | Guu et al. |
| 2013/0187156 | A1 | 7/2013 | Chen et al. |
| 2013/0285055 | A1 | 10/2013 | Takayanagi |
| 2014/0167803 | A1 | 6/2014 | Shaue et al. |
| 2014/0175439 | A1 | 6/2014 | Lee |
| 2014/0266283 | A1 | 9/2014 | Wu et al. |
| 2014/0300379 | A1 | 10/2014 | Rychaert et al. |
| 2015/0008949 | A1 | 1/2015 | Torreiter et al. |
| 2015/0228547 | A1 | 8/2015 | Shih |
| 2015/0293149 | A1* | 10/2015 | Koo ............ G01R 1/06738 324/755.01 |
| 2016/0300788 | A1 | 10/2016 | Agarwal et al. |
| 2017/0062291 | A1 | 3/2017 | Arvin et al. |

OTHER PUBLICATIONS

Banijamali et al., "Advanced Reliability Study of TSV Interposers and Interconnects for the 28nm Technology FPGA", 2011 Electronic Components and Technology Conference, 978-1-61284-498-5/11, 2011 IEEE, pp. 285-290.

Chi et al., "Multi-Visit TAMs to Reduce the Post-Bond test length of 2.D-SiCs with a Passive Silicon Interposer Base", 2011 Asian Symposium, 1081-7735/11 2-11 IEEE, DOI 10.1109/ATS.2011.36, pp. 451-456, IEEE computer society.

Li et al., "Development of an Optimized power delivery System for 3D IC Integration with TSV Silicon Interposer", 978-1-4673-1965-2/12 2012 IEEE, pp. 678-682.

\* cited by examiner

700

3D CHIP TESTING THROUGH MICRO-C4 INTERFACE

CROSS-REFERENCE TO RELATED APPLICATIONS

This application is a divisional of copending U.S. patent application Ser. No. 15/671,738 filed Aug. 8, 2017, which is a divisional of U.S. patent application Ser. No. 14/148,779, filed Jan. 7, 2014 and issued as U.S. Pat. No. 9,726,691. The entire contents and disclosures of U.S. patent application Ser. Nos. 15/671,738 and 14/148,779 are hereby incorporated herein by reference.

BACKGROUND

The embodiments of the present invention relate to semiconductor device manufacturing, and more particularly to structures and methods of directly testing semiconductor wafers having bonding pads and micro-bonding pads. The bonding pads and micro-bonding pads may be small electrical contacts formed on the surface of an integrated circuit and used for joining multiple integrated circuits in a three-dimensional package.

New integrated circuit (IC) technologies may include individual IC chips (i.e., "dies") arranged into a three-dimensional integrated circuit, also known as a three-dimensional semiconductor package (3D package). One type of 3D package can include two or more layers of active electronic components stacked vertically and electrically joined with some combination of through-substrate vias and solder bumps. The 3D package can provide numerous benefits such as increased package density yielding a smaller footprint, and improved bandwidth due to the short connection lengths between the individual dies.

One example of a 3D package may include a die stack and a laminate substrate. The die stack may include at least two die or IC chips. The die may be stacked on top of one another, and electrically and mechanically joined using a combination of through-substrate vias (TSVs) and a first plurality of solder connections (i.e., Controlled Collapse Chip Connections (C4), flip chip connections). The TSVs can drastically reduce interconnect distance as compared to other typical interconnect methods, such as, for example, wire bonding. The small interconnect distances may enable faster communication speeds, may lower power consumption, and may ultimately reduce the overall package size. The dies may contain devices with small feature sizes, including processor devices, which may require smaller connection points, so micro-solder bumps having a much smaller pitch than traditional solder bumps may be used.

The die stack may further be electrically and mechanically joined to the laminate substrate using a second plurality of solder bump connections. Generally, the second plurality of solder connections between the laminate substrate and the die stack are larger than the first plurality of solder bump connections between successive die in the die stack. Therefore, the second plurality of solder connections may be fewer in quantity with a greater pitch or spacing than the first plurality of second bump connections. The second plurality of solder connections may have a pitch of approximately 185 μm.

SUMMARY

According to one embodiment of the present invention, a method is disclosed. The method may include: forming a through substrate via (TSV) through an entire thickness of an integrated circuit (IC) chip, the TSV may electrically connect a first surface of the IC chip to a second surface on an opposite side of the IC chip; and forming a pattern of micro-solder connections around the TSV on the first surface of the IC chip, a center of an individual micro-solder connection in the pattern may be separated from a center of another individual micro-solder connection by a distance of approximately 62 μm, and the pattern of micro-solder connections may allow the IC chip to be electrically tested by directly contacting the micro-solder connections with an electrical probe tip.

According to another embodiment of the present invention, a method is disclosed. The method may include: assigning an electrical test signal to a pattern of micro-solder connections formed on a first surface of an IC chip, a center of an individual micro solder connection in the pattern may be separated from a center of another individual micro-solder connection by a distance of approximately 62 μm; providing power to the pattern of micro-solder connections for electrical testing from a second surface located on an opposite side of the IC chip using a through substrate via (TSV); and testing the IC chip using electrical probing by contacting the pattern of micro solder connections directly with one or more contact points of a single electrical testing probe tip.

According to another embodiment of the present invention, a structure is disclosed. The structure may include: an electrical testing probe tip having one or more contact points that are aligned on a pitch of approximately 62 μm.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
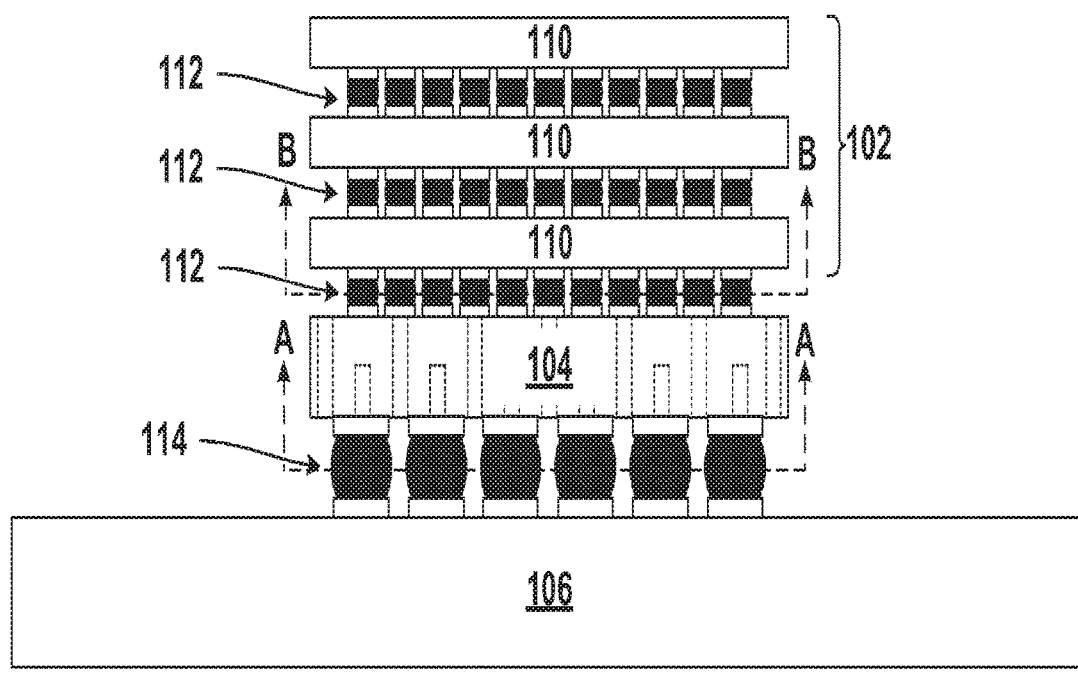
FIG. 1 is a side view illustrating a three dimensional semiconductor package, according to an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

In the following description, numerous specific details are set forth, such as particular structures, components, materials, dimensions, processing steps, and techniques, in order to provide a thorough understanding of the present invention. However, it will be appreciated by one of ordinary skill of the art that the invention may be practiced without these specific details. In other instances, well-known structures or processing steps have not been described in detail in order to avoid obscuring the invention. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath," "below," or "under" another element, it can be directly beneath or under the other element, or intervening elements may be present. In contrast, when an element is referred to as being "directly beneath" or "directly under" another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Typically, 3D packages are electrically tested for reliability and/or performance using thin film interposer (TFI) probes that contact bonding pods through talking points on TFI probe tips. More particularly, TFI probes are mounted on a high performance glass ceramic (HPGC) module that is in turn mounted to a printed circuit board (PCB) that controls and registers the electrical testing. However, conventional HPGC modules do not support TFI probes with pitches below 185 μm. Therefore, typically, solder connections carrying power, ground, and signals required for wafer testing must be at least 185 μm apart to be tested directly with TFI probes. While the bottom of the 3D package, which uses larger conventional solder connections to connect to an interposer to the organic laminate substrate, may be tested directly, this means that a 3D package can typically only be tested after it is completed. This may lead to higher costs and waste. The individual die in the 3D package, which use micro-solder connections to connect to smaller devices, cannot be directly tested using a conventional TFI probe due to the smaller pitch of the contacts.

To work around this issue, a testing interposer is commonly used to transfer the smaller scale pitch of the micro-solder connections to the compatible with the TFI probe. The testing interposer is a double-sided wafer with no active devices. The testing interposer may have one side with micro-solder connections having the smaller pitch and a second side with solder connections on a pitch of approximately 185 μm. An individual die (or die stack) may then be bonded to the smaller pitch side of the testing interposer and a conventional TFI probe may then be used to test the die (or die stack) through the side of the testing interposer having the larger pitch. The die (or die stack) may then be separated from the testing interposer and replated with micro-solder connections. This conventional approach may introduce additional process steps and costs associated with using the testing interposer to test the die (or die stack) and may damage the die (or die stack) during bonding, separating, and replating the top wafer.

Embodiments of the present invention relate to semiconductor device manufacturing, and more particularly to structures and methods of directly testing semiconductor wafers having micro-solder connections. Embodiments by which to form unique patterns of micro-solder connections on IC chips to enable direct testing, without the use of a testing interposer, are described in detail below with reference to the accompanying drawings FIGS. 1-3. In addition, embodiments of novel electrical testing probe tip structures, compatible with direct testing both solder connections and the disclosed unique patterns of micro-solder connections, are described in detail below with reference to the accompanying drawings FIGS. 4-15.

Referring now to FIG. 1, a 3D semiconductor package 100 (hereinafter "3D package"), is shown according to one embodiment. The 3D package 100 may include a die stack 102, an interposer 104, and a laminate substrate 106. Generally, the die stack 102 is coupled to the interposer 104, and the interposer 104 is coupled to the laminate substrate 106. Micro-solder connections 112 (i.e., Controlled Collapse Chip Connection (C4) pads, flip chip connections) may be used to electrically join individual die 110 together, and to join the die stack 102 to the interposer 104. Solder connections 114 may be used to electrically join the interposer 104 to the laminate substrate 106. Generally, the micro-solder connections 112 and the solder connections 114 may include an array of small spherical solder balls on the surface of the chip before the chip is joined to an adjoining structure, such as, for example, another chip, an interposer, or a substrate. More specifically, each individual micro-solder connection 112 and solder connection 114 may include a bonding pad on the chip, a spherical solder bump (i.e., ball), and a corresponding bonding pad on the adjoining structure.

In an embodiment, the micro-solder connections 112 may be generally smaller and disposed with a smaller pitch or higher density than the solder connections 114. For example, the pitch between two adjacent individual solder connections in the micro-solder connections 112 may be approximately 62 µm, and the pitch between two adjacent individual solder connections in the solder connections 114 may be approximately 185 µm.

Examples of the die 110 may include a memory die, a logic die, or a processor die. The interposer 104 can simply include an electrical interface which may provide connectivity between the laminate substrate 106 and the die stack 102. The interposer 104 can be used to spread one connection array to a wider pitch or reroute a particular connection to a different location. The interposer 104 can also include semiconductor devices, such as, for example, a passive device and a field effect transistor. In addition, the interposer 104 may be used to lessen or reduce the occurrence of failures caused by thermal expansion. The laminate substrate 106 may include a silicon substrate, a laminated composite, or an organic composite.

Figure 2:
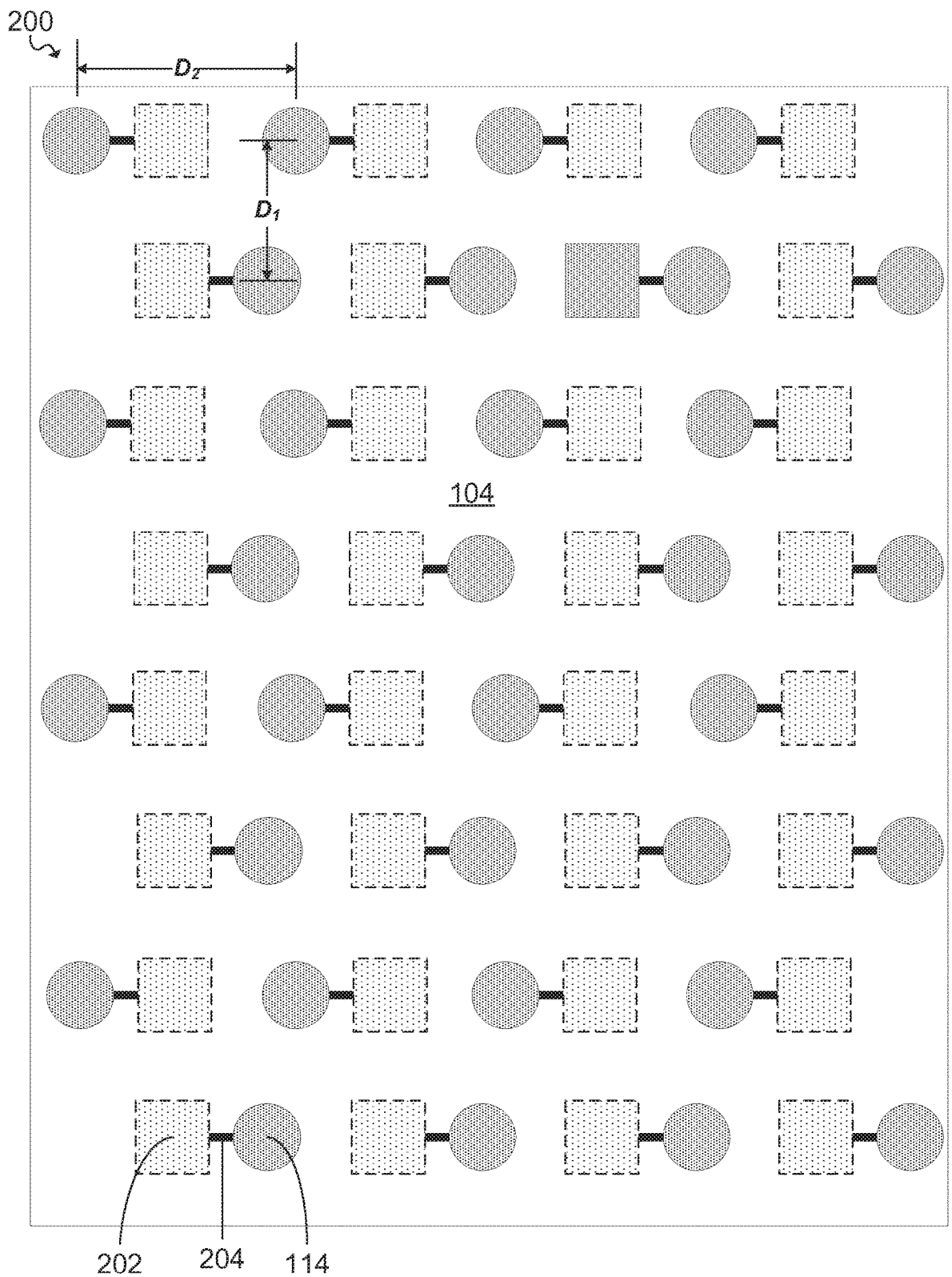
FIG. 2 is a top view illustrating an array of solder connections formed on a surface of a bottom wafer, according to an embodiment of the present invention.

Referring now to FIG. 2, a cross section view of FIG. 1, along section line A-A is shown according to an embodiment. FIG. 2 illustrates an array of solder connections 114 formed on a surface 200 of the interposer 104 in the 3D package 100 (FIG. 1). Each of the individual solder connections 114 may be connected to a through-substrate via (TSVs) 202 by a metal line 204. The solder connections 114 may have a diameter ranging from approximately 80 µm to approximately 100 µm and may be formed by any conventional method of forming solder connections known in the art, such as evaporation, plating, stencil printing, paste screening, molten solder injection, and electroplate soldering. The solder connections 114 may be formed in a pattern so that a center an individual solder connection 114 may be separated from a center another individual solder connection by a minimum distance $D_1$ of approximately 161 µm and a maximum distance $D_2$ of approximately 185 µm.

In one embodiment, the solder connections 114 may be composed at least one material, such as a lead-free alloy (e.g., gold (Au), a tin/silver/copper (Sn/Ag/Cu) allow, or other lead-free alloys), a lead-containing alloy (e.g., a lead/tin (Pb/Sn) alloy), copper (Cu), aluminum (Al), a conductive polymer, other conductive metals, and combinations thereof. In another embodiment, the solder connections 114 may be composed of multiple layers including, but not limited to, a lower adhesion layer (not shown), a middle reaction barrier layer (not shown), and a wettable upper layer (not shown). The lower layer (not shown) may provide adhesion to the surface 200, and may also serve as a diffusion/reaction barrier layer. The lower adhesion layer (not shown) may be composed of a conductive material, such as, but not limited to chromium (Cr), tantalum (Ta), tungsten (W), titanium (Ti), zirconium (Zr), and alloys and nitrides thereof. The middle reaction barrier layer (not shown) may be solderable by molten solder and may be composed of a conductive material such as, but not limited to, Cr, Cu, Al, nickel (Ni), and alloys thereof. The wettable upper layer (not shown) may allow for easy solder wetability and a fast reaction with solder. The wettable upper layer (not shown) may be composed of a conductive material such as, but not limited to, Cu.

The solder connections 114 may be connected to the TSVs 202 through the metal line 204 formed in the interposer 104. The metal line 204 may be composed of a conductive material such as, for example, Cu or Al, and may be formed by any conventional deposition process. The TSVs 202 may be formed through an entire thickness of interposer 104. The TSVs 202 may electrically connect a first surface of an IC chip (or interposer) to an opposite side of the IC chip (or interposer). The TSVs 202 may be formed by any conventional etching and deposition techniques known in the art. In one embodiment, a trench (not shown) may be formed through the entire thickness of the interposer 104 through a conventional etching process, and the trench (not shown) may be filled with a conductive material such as, for example, Cu or Al. Power/ground and input/output (IO) signals may be carried from the solder connection 114 to the metal line 204 and then through the interposer 104 via the TSV 202.

Because the solder connections 114 are formed in a pattern so that an individual solder connection 114 may be separated from a center another individual solder connection by a minimum distance $D_1$ of approximately 161 µm and a maximum distance $D_2$ of approximately 185 µm, the solder connections 114 may be directly tested with the electrical testing probe tips described below in detail with reference to FIGS. 4-15. This may allow for the chip stack 102 (FIG. 1) to be tested after the 3D package 100 is completed. An embodiment by which to form micro-solder connections 112 on individual die 110 in the chip stack 102 that can be directly tested with the disclosed electrical testing probe tips is described below in detail with reference to FIG. 4-15.

Figure 3:
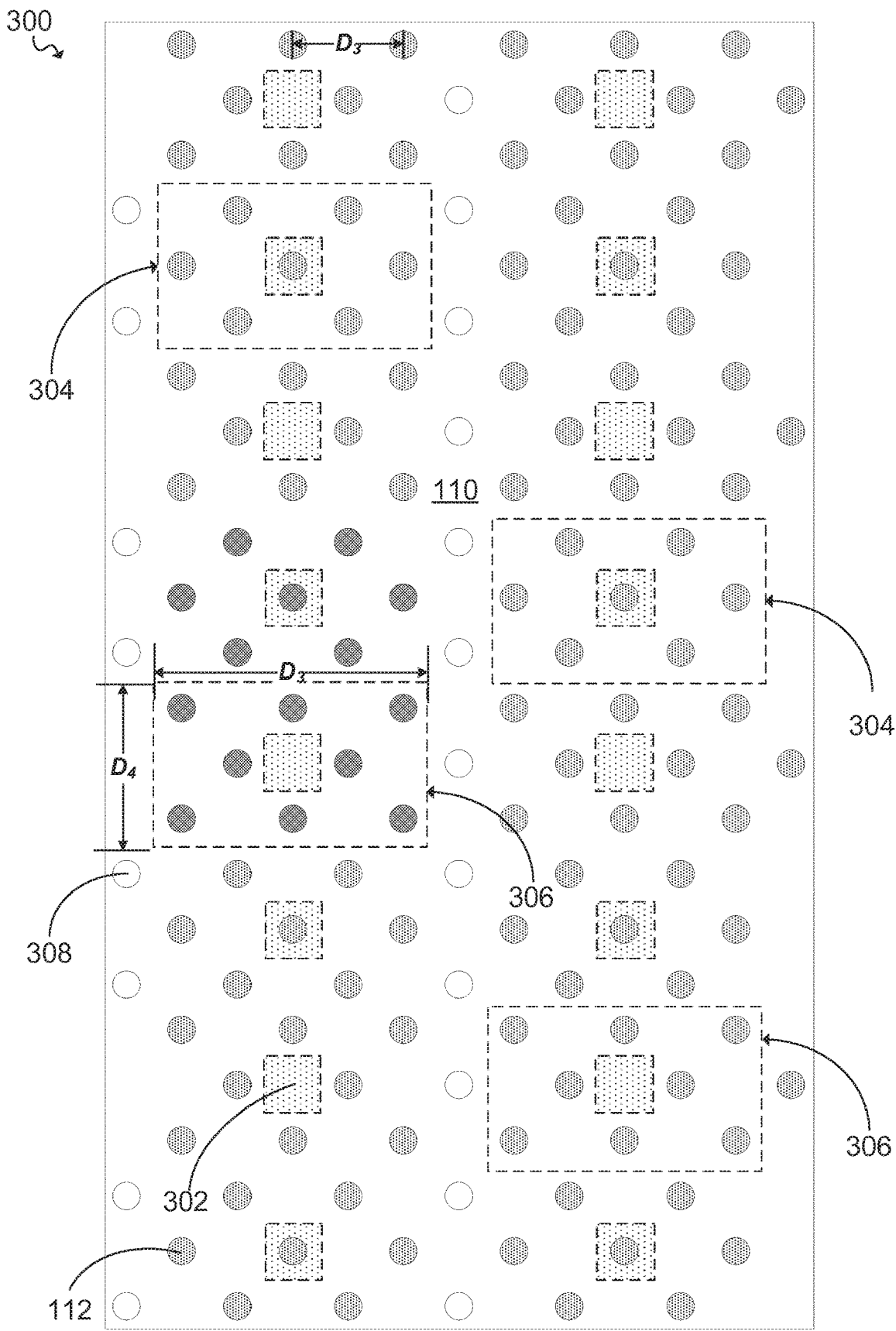
FIG. 3 is a top view illustrating an array of micro-solder connections formed on a surface of a die, according to an embodiment of the present invention.

Referring now to FIG. 3, a cross section view of FIG. 1, along section line B-B is shown according to an embodiment. FIG. 3 illustrates an array TSVs 302 and an array of micro-solder connections 112 formed on a surface 300 of a die 110 in the 3D package 100 (FIG. 1). In an embodiment, the surface 300 may represent a core region (i.e., carrying power and ground signals) of the die 110. In another embodiment, the surface 300 may represent an IO region of the die 110. The surface 300 may be formed above device structures (not shown) present in the die 110. In an embodiment, the surface 300 may be aligned with, and bonded to, another surface having micro-solder connections in the 3D package. In an embodiment in which the die 110 is bonded to the interposer 104, the TSVs 302 may be aligned with the TSVs 202.

In an embodiment, the TSVs 302 may be substantially similar to the TSVs 202 (FIG. 1) and may be formed using substantially similar techniques as those described above with reference to FIG. 1. The micro-solder connections 112 may be formed in which a center of an individual micro-solder connection 112 may be separated from a center another individual micro-solder connection 112 by a distance $D_3$ of approximately 62 µm. The micro-solder connections 112 may have a diameter ranging from approximately 20 µm to approximately 30 µm and may be formed by any conventional method of forming micro-solder connections known in the art, such as evaporation, plating, stencil printing, paste screening, molten solder injection, and electroplate soldering. In one embodiment, the micro-solder connections 112 may be composed of at least one material, such as a lead-free alloy (e.g., gold (Au), a tin/silver/copper (Sn/Ag/Cu) allow, or other lead-free alloys), a lead-containing alloy (e.g., a lead/tin (Pb/Sn) alloy), copper (Cu), aluminum (Al), a conductive polymer, other conductive metals, and combinations thereof. In another embodiment, the micro-solder connections 112 may be composed of multiple layers, similar to the solder connections 114 (FIG. 2) as described above with reference to FIG. 2.

The array of the micro-solder connections 112 in combination with the TSVs 302 may result in patterns of multiple micro-solder connections 112 that share an assigned common power/ground or IO signal grid with a TSV 302 that can be contacted directly through a single electrical testing probe tip. A first pattern 304 may include six (6) micro-solder connections 112 arranged in a hexagonal pattern surrounding one (1) central micro-solder connection 112 formed over a TSV 302. A second pattern 306 may include nine (9) micro-solder connections 112 surrounding a TSV 302: 3 micro-solder connections 112 on the surface 300 above the TSV 302, 1 micro-solder connection 112 on the surface 300 to the left of the TSV 302, 1 micro-solder connection 112 on the surface 300 to the right of the TSV 302, and 3 micro-solder connections 112 on the surface 300 below the TSV 302. Both the first pattern 304 and the second pattern 306 may have an overall length $D_4$ of approximately 185.4 µm and an overall width $D_5$ of approximately 161.28 µm, enabling them to be directly tested with the electrical testing probe tips described below in detail with reference to FIGS. 4-15. In an embodiment in which the surface 300 is a portion of an IO region, additional micro-solder connections 308 may not be required for electrical testing.

The first pattern 304 and the second pattern 306 may allow for the power required to test the die 110 to be delivered during electrical testing, such as, for example, TFI probing. Because the electro-migration (EM) current limit of each of the micro-solder connections 112 may range from approximately 25 mA to approximately 50 mA, the hexagonal arrangement of the micro-solder connections 112 in the first pattern 304 and the arrangement of the 9 micro-solder connections 112 in the second pattern 306 may allow for enough current to pass through to the electrical probe to permit testing, particularly during elevated voltage setting (EVS) testing.

Along with the arrays of solder connections 114 and micro-solder connections 112 described above with reference to FIGS. 1-3 that may allow for direct electrical testing of die 110 in a 3D package 200 without the need for a testing interposer, embodiments of novel electrical probe structures that may be used for the direct testing are described in detail below with reference to the accompanying drawings FIGS. 4-15.

Figure 4:
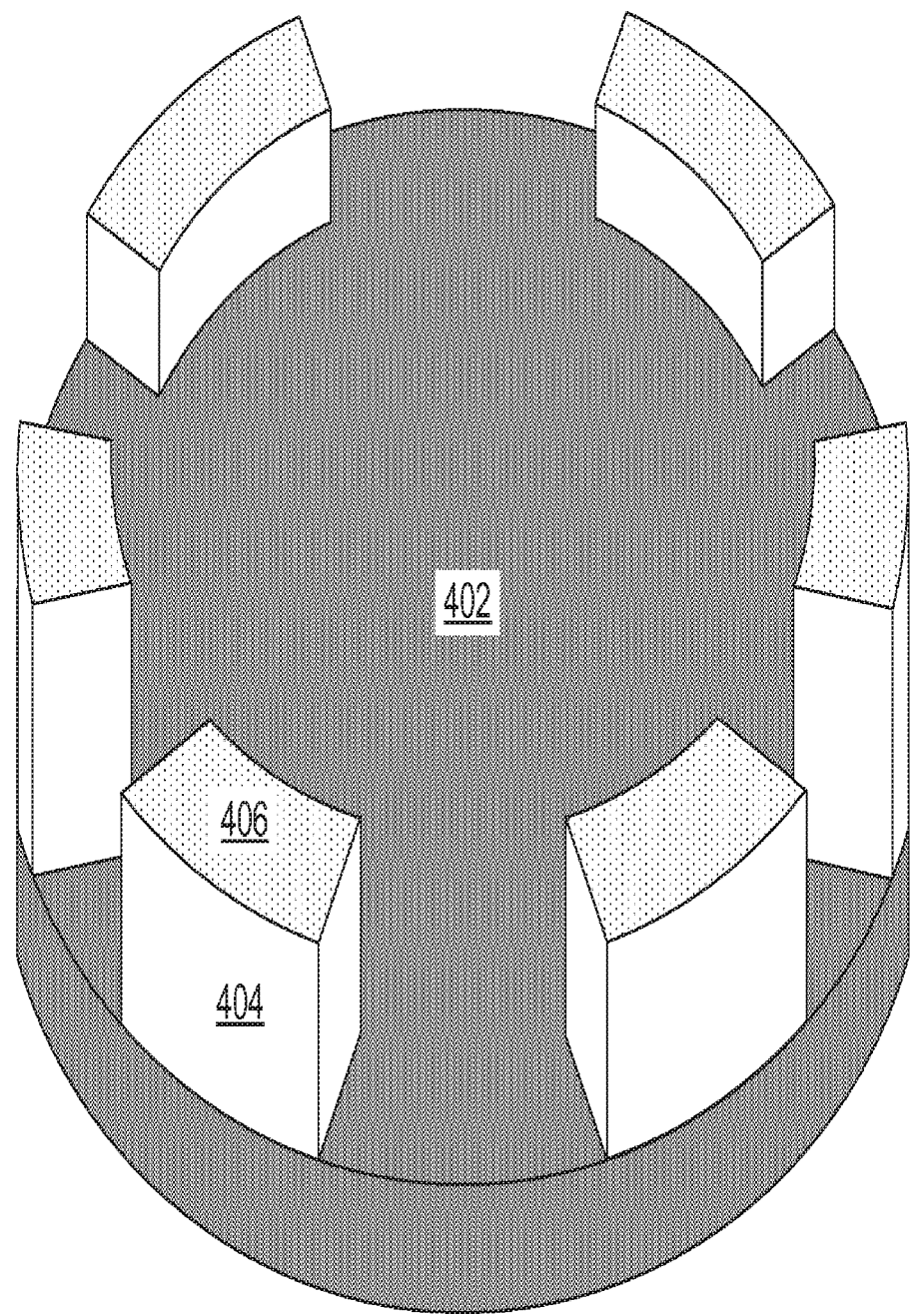
FIG. 4 is an isometric view of a first electrical probe tip, according to an embodiment of the present invention.
Figure 5:
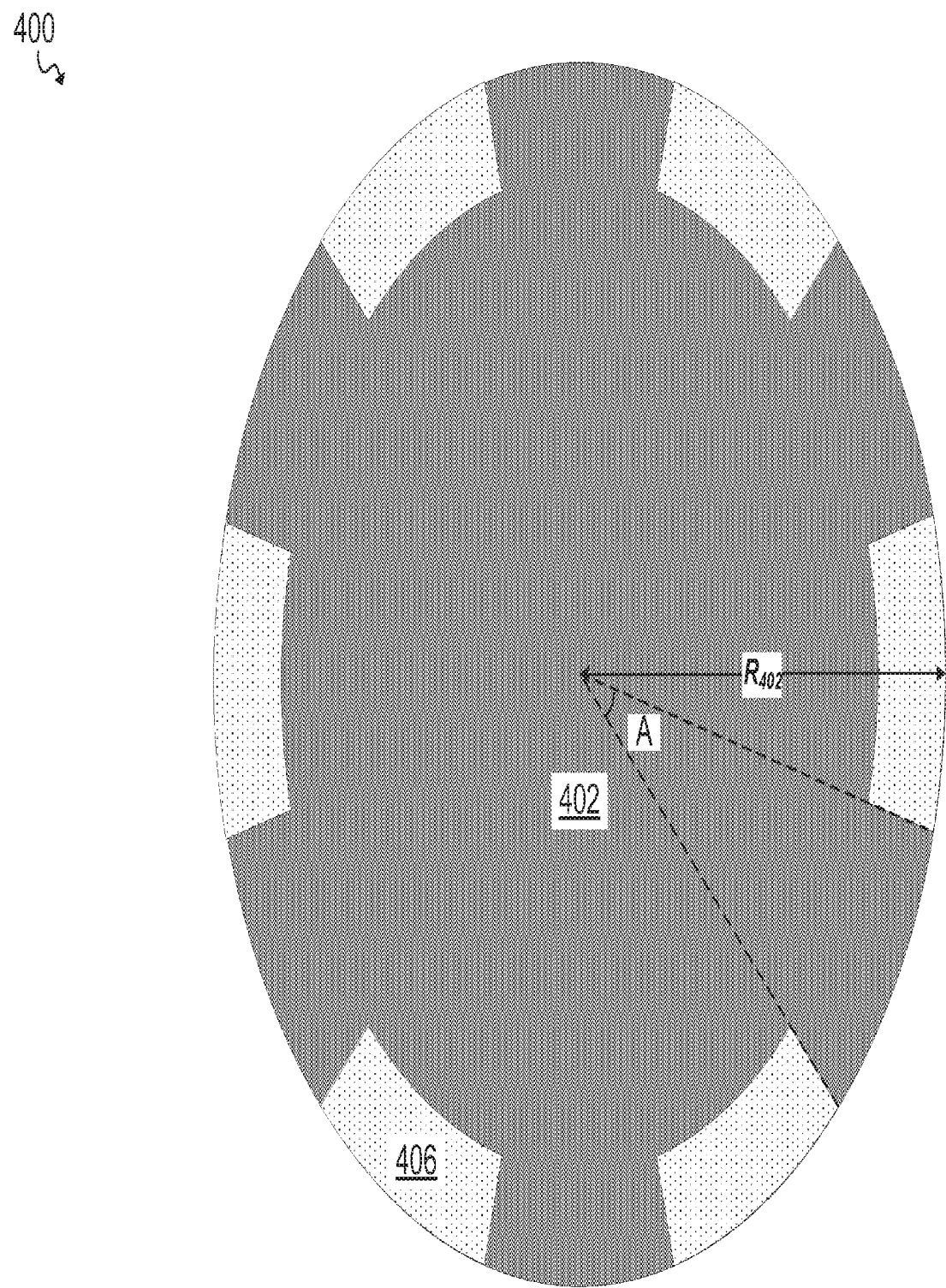
FIG. 5 is a top view of the first electrical probe tip, according to an embodiment of the present invention.
Figure 6:
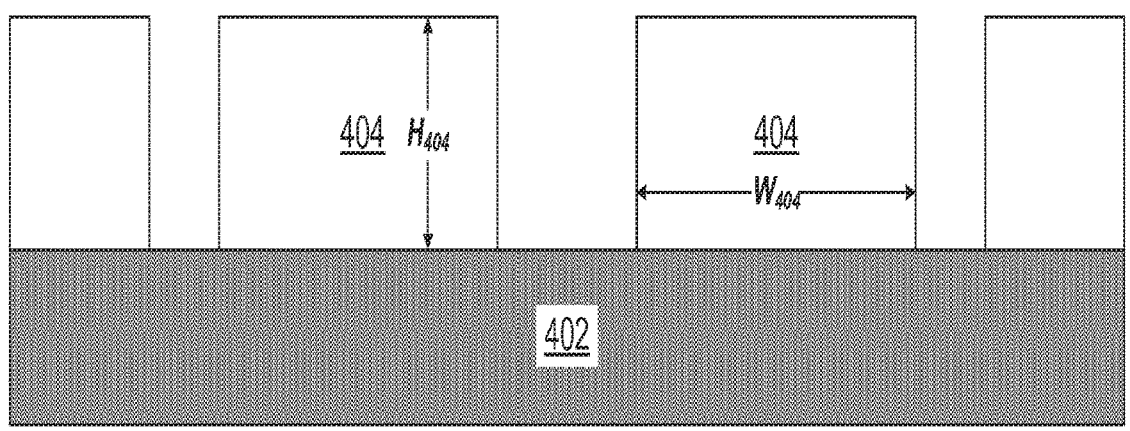
FIG. 6 is a side view of the first electrical probe tip, according to an embodiment of the present invention.

Referring now to FIGS. 4-6, and in one embodiment, a first electrical probe tip 400 is shown. FIG. 4 is an isometric view of the first electrical probe tip 400. FIG. 5 is a top view of the first Electrical probe tip 400. FIG. 6 is a side view of the first electrical probe tip 400. The first electrical probe tip may have a circular shape. The first electrical probe tip 400 may have a base 402 having a radius $R_{402}$ of approximately 62 µm. The first electrical probe tip 400 may have talking points 404 that rise above the base and contact the micro-solder connections 112 (FIG. 3) on an upper surface 406 during electrical testing, such as, for example TFI probing. The talking points 404 may be on the periphery of the base 402 and separated by an angle A of approximately 30 degrees. The talking points 404 may have a height $H_{404}$ of approximately 30 µm to approximately 50 µm and a width $W_{404}$ of approximately 10 µm to approximately 30 µm, which may be less than the overall width of the base 402. The first electrical probe tip 400 may be used to test for power or ground signals in the structure 200 (FIG. 2). The first electrical probe tip 400 may be composed of a conductive material commonly used in conventional electrical probe tips and may be formed using conventional methods of forming electrical probe tips.

Figure 7:
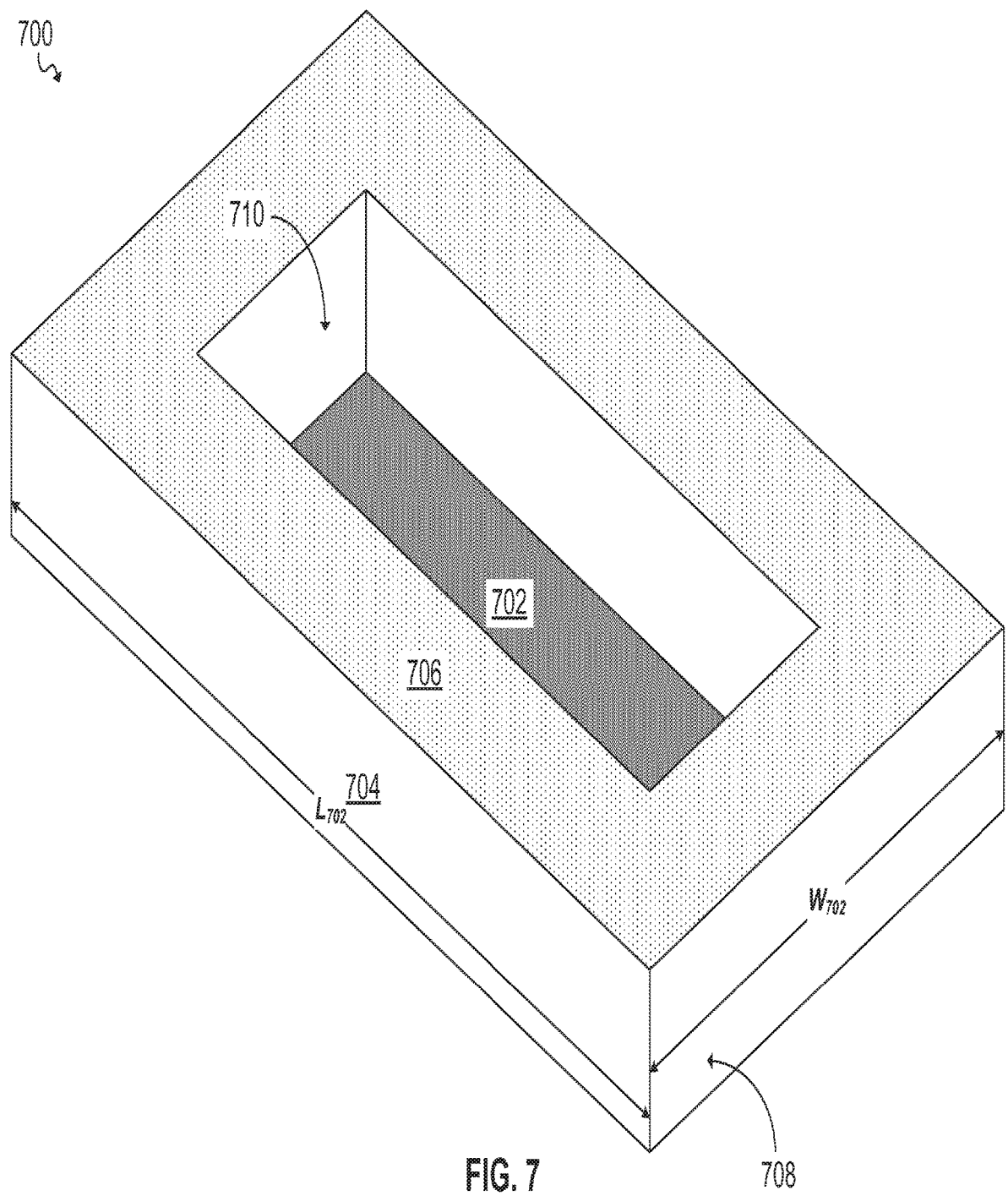
FIG. 7 is an isometric view of a second electrical probe tip, according to an embodiment of the present invention.
Figure 8:
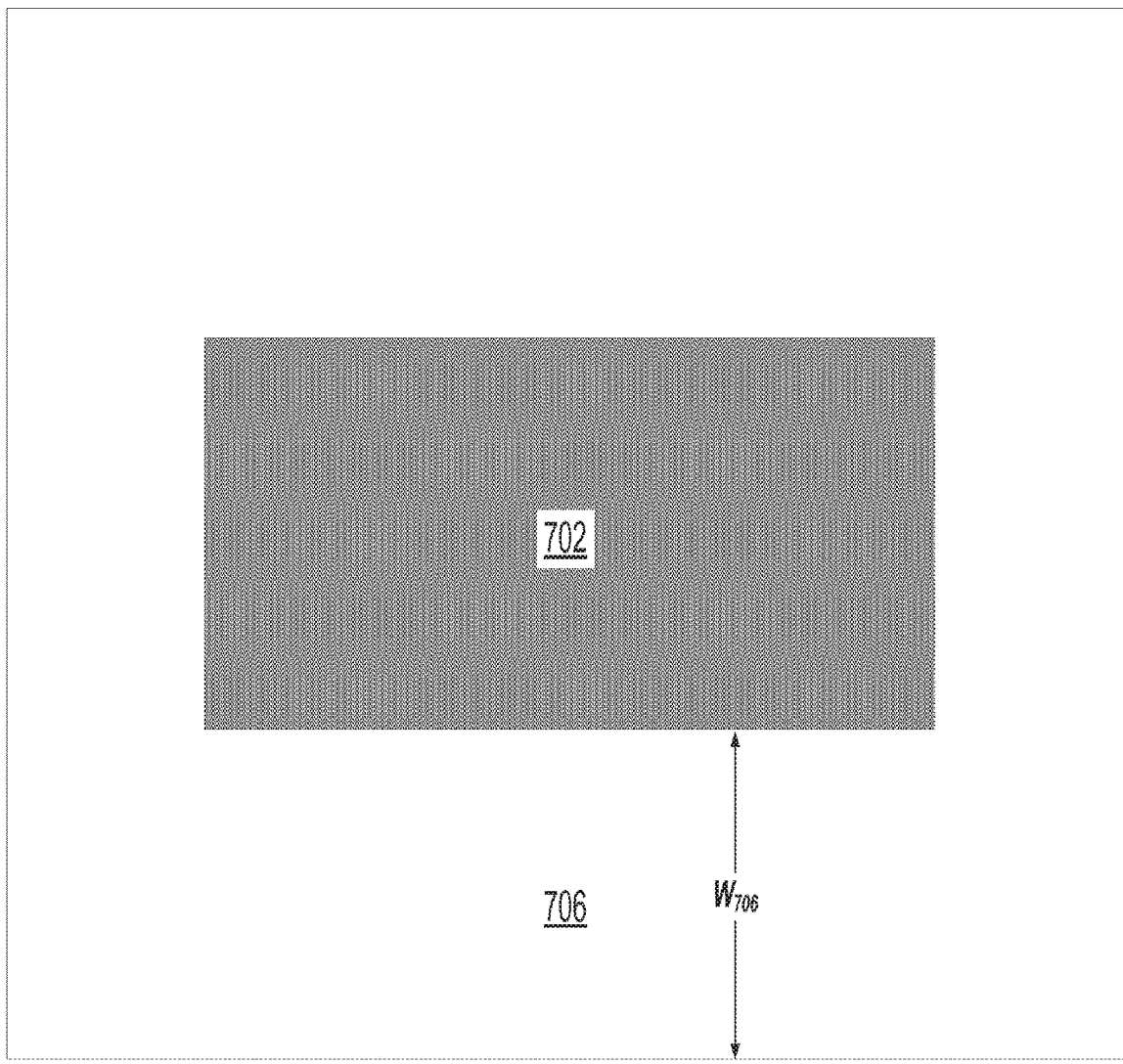
FIG. 8 is a top view of the second electrical probe tip, according to an embodiment of the present invention.
Figure 9:
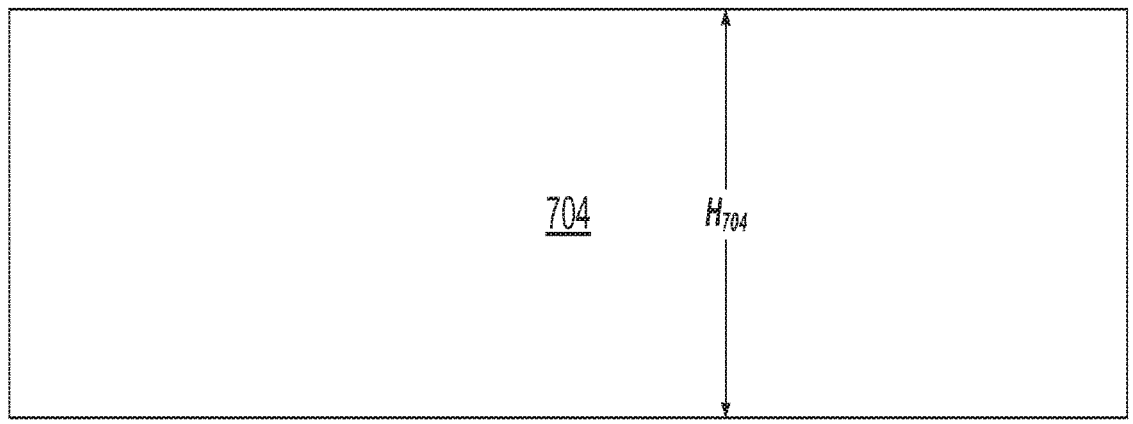
FIG. 9 is a side view of the second electrical probe tip, according to an embodiment of the present invention.

Referring now to FIGS. 7-9, and in another embodiment, a second electrical probe tip 700 is shown. FIG. 7 is an isometric view of the second electrical probe tip 700. FIG. 8 is a top view of the second electrical probe tip 700. FIG. 9 is a side view of the second electrical probe tip 700. The second TFI probe tip 700 may have a rectangular shape. The TFI second probe tip 700 may have a base 702 having a length $L_{702}$ ranging from approximately 125 µm to approximately 145 µm and a width $W_{702}$ ranging from approximately 110 µm to approximately µm. The second electrical probe tip 700 may also have a continuous talking point 704 that is raised above the base and contacts the micro-solder connections 112 (FIG. 3) on an upper surface 706 during electrical testing, such as, for example TFI probing. The continuous talking point 704 may have the same length and width as the base 702 and may have a height $H_{704}$ ranging from approximately 30 µm to approximately 30 µm. The upper surface 706 may have a width $W_{706}$ ranging from approximately 10 µm to approximately 30 µm. The continuous talking point 704 may have an outer sidewall 708 that is substantially flush with an outside of the base 702, and an inner sidewall 710 located between a center of the base 702 and the outside of the base 702. The second electrical probe tip 700 may be used to test for power or ground signals in the structure 200 (FIG. 2). The second electrical probe tip 700 may be composed of a conductive material commonly used in conventional electrical probe tips and may be formed using conventional methods of forming electrical probe tips.

Figure 10:
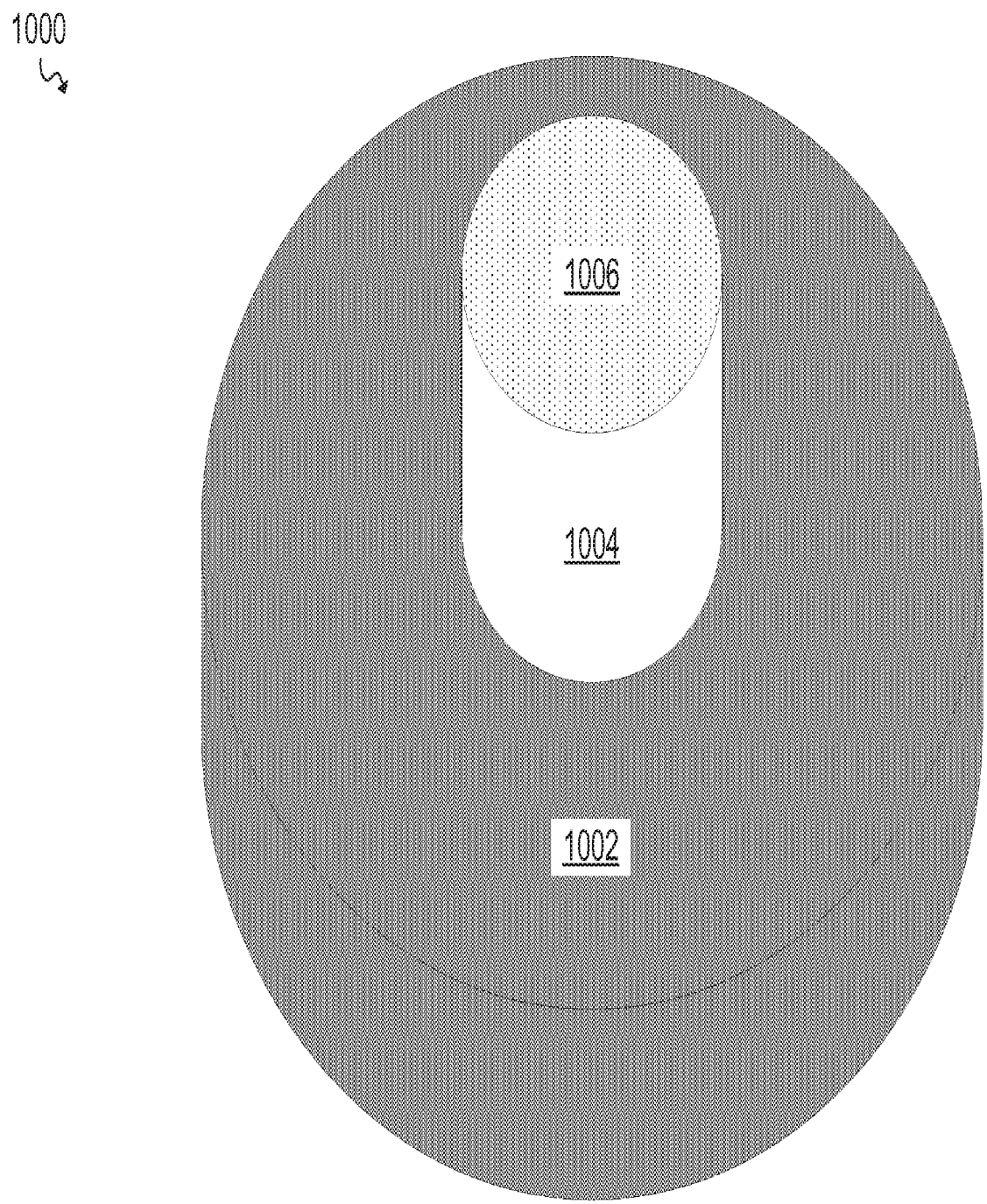
FIG. 10 is an isometric view of a third electrical probe tip, according to an embodiment of the present invention.
Figure 11:
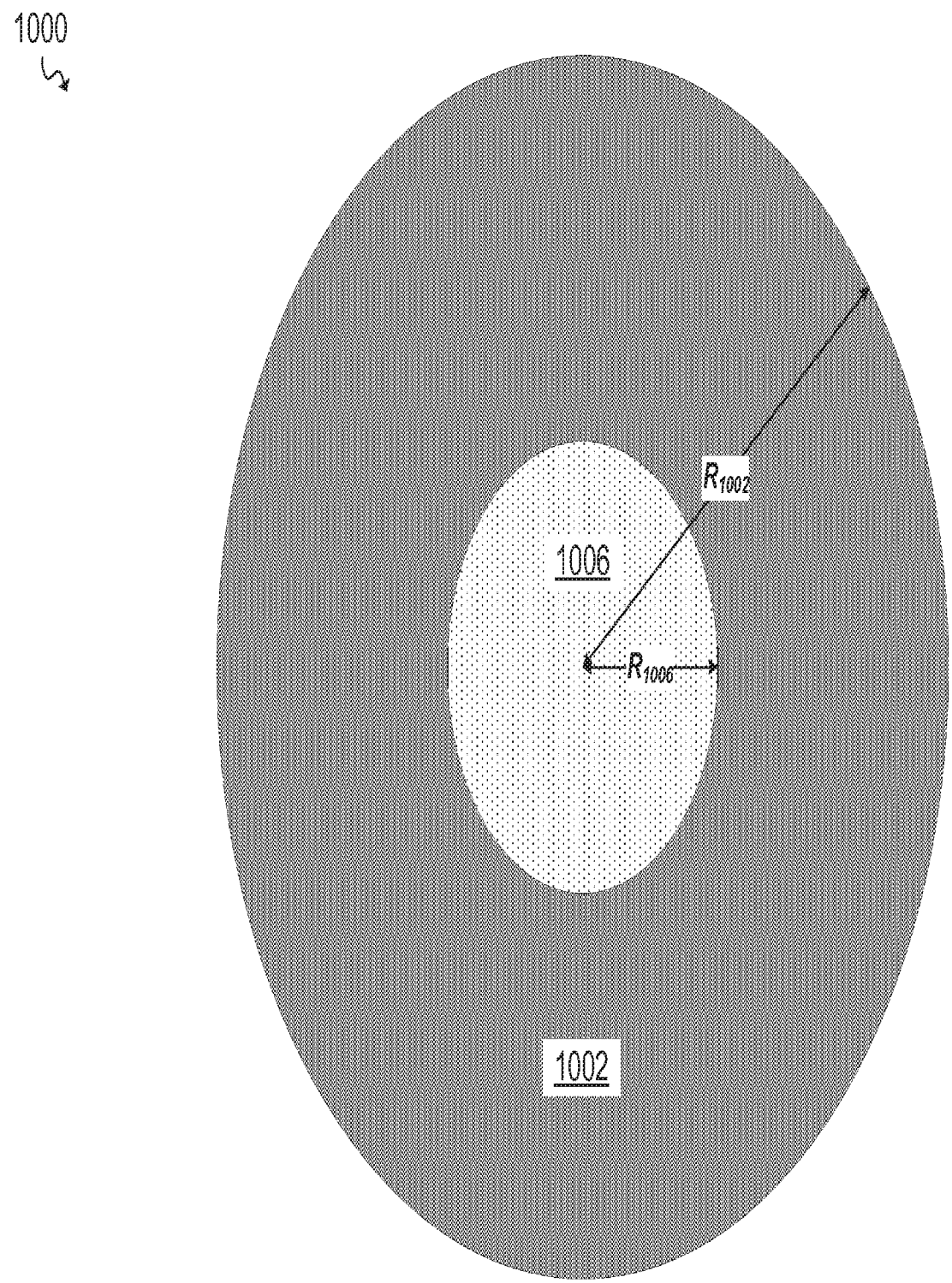
FIG. 11 is a top view of the third electrical probe tip, according to an embodiment of the present invention.
Figure 12:
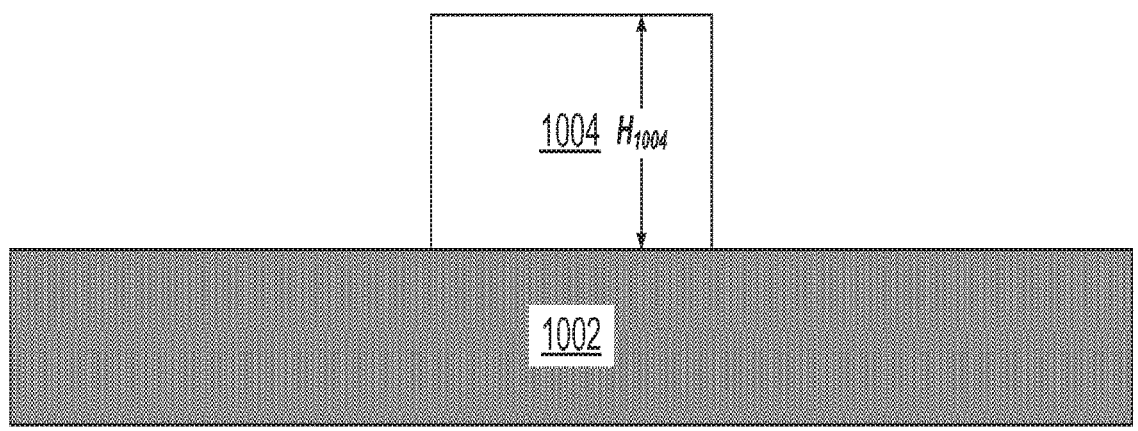
FIG. 12 is a side view of the third electrical probe tip, according to an embodiment of the present invention.

Referring now to FIGS. 10-12, and in another embodiment, a third electrical probe tip 1000 is shown. FIG. 10 is an isometric view of the third electrical probe tip 1000. FIG. 11 is a top view of the third electrical probe tip 1000. FIG. 12 is a side view of the third electrical probe tip 1000. The third TFI 1000 probe tip may have a circular shape. The third electrical probe tip 1000 may have a base 1002 having a radius $R_{1002}$ ranging from approximately 80 µm to approximately 100 µm. The third electrical probe tip 1000 may have a single talking point 1004 that is raised above the center of the base 1002 and contacts the micro-solder connections 112 (FIG. 3) on an upper surface 1006 during electrical testing, such as, for example TFI probing. The talking point 1004 may have a height $H_{1004}$ of approximately 30 µm to approximately 50 µm. The upper surface 1006 may have a radius $R_{1006}$ of approximately 10 µm to approximately 20 µm. The third electrical probe tip 1000 may be used to test for IO signals in the structure 300 (FIG. 3). The third electrical probe tip 1000 may be composed of a conductive material commonly used in conventional electrical probe tips and may be formed using conventional methods of forming electrical probe tips.

Figure 13:
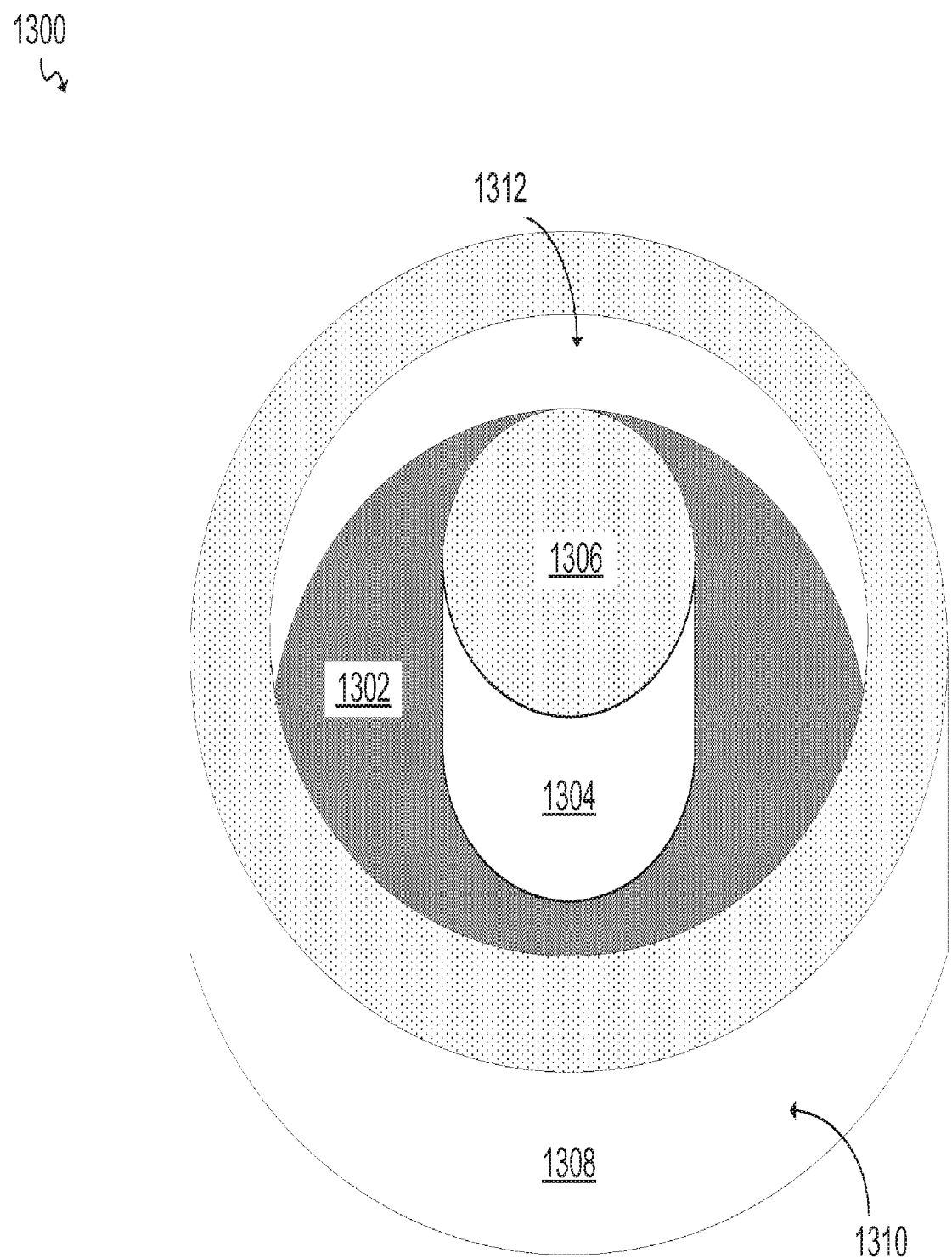
FIG. 13 is an isometric view of a fourth electrical probe tip, according to an embodiment of the present invention.
Figure 14:
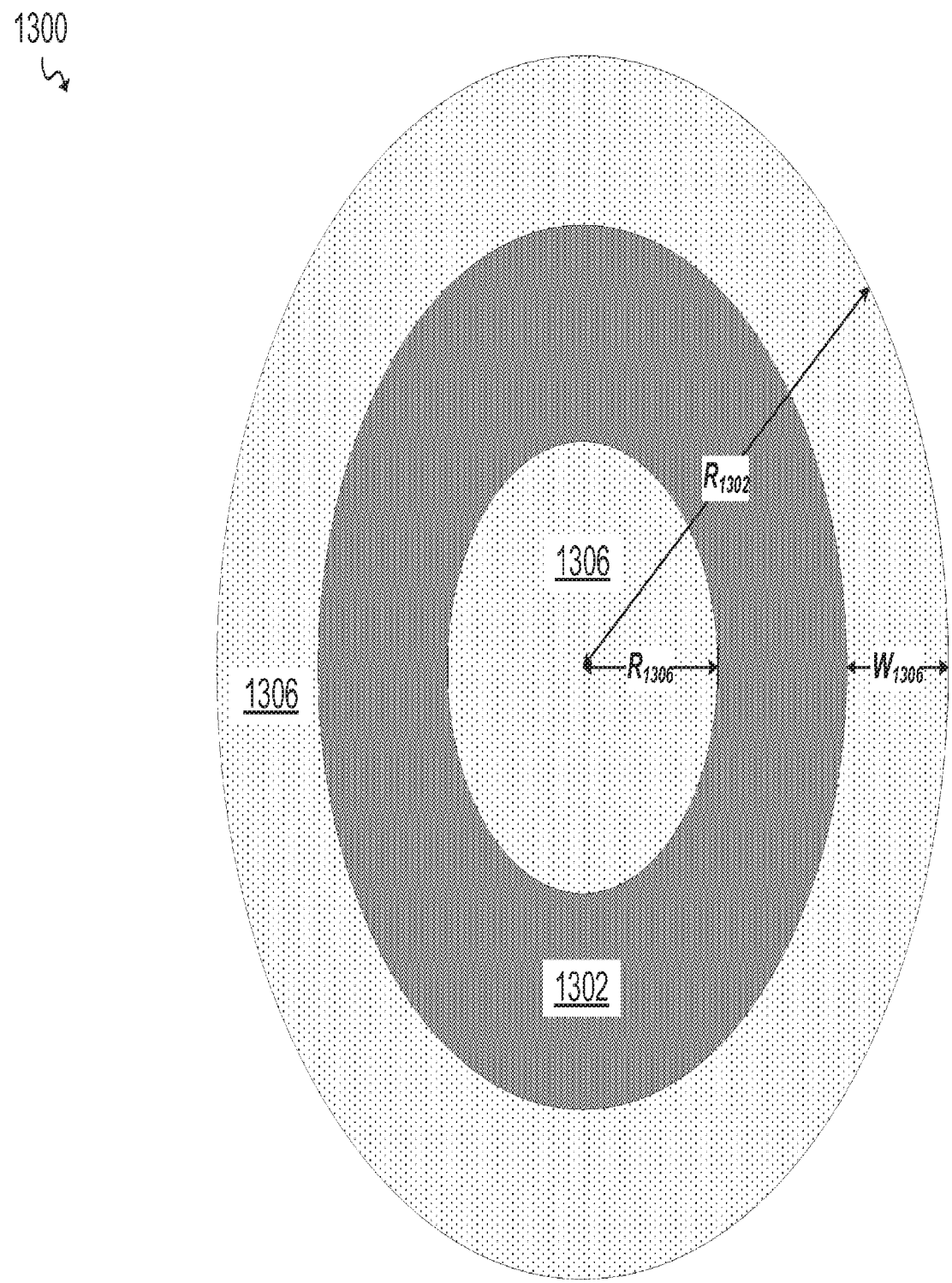
FIG. 14 is a top view of the fourth electrical probe tip, according to an embodiment of the present invention.
Figure 15:
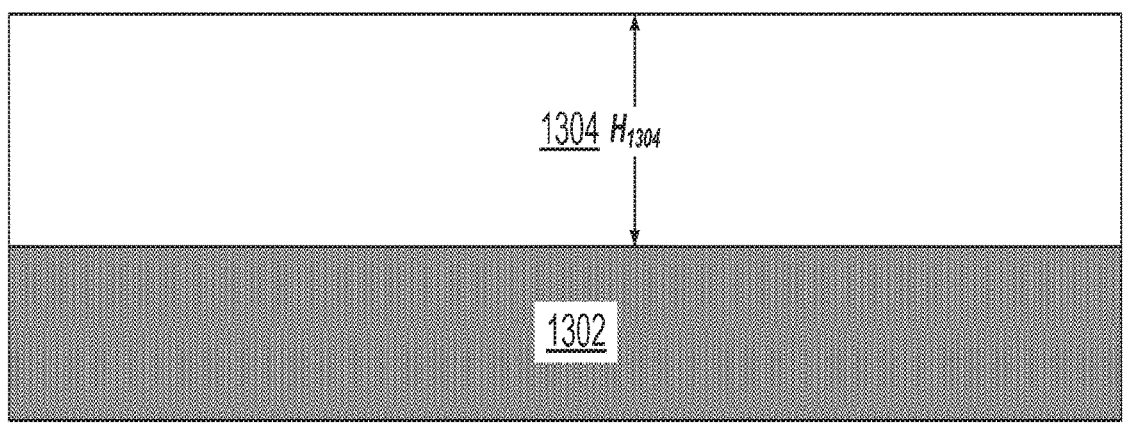
FIG. 15 is a side view of the fourth electrical probe tip, according to an embodiment of the present invention.

Referring now to FIGS. 13-15, and in another embodiment, a fourth electrical probe tip 1300 is shown. FIG. 13 is an isometric view of the fourth electrical probe tip 1300. FIG. 14 is a top view of the fourth electrical probe tip 1300. FIG. 15 is a side view of the fourth electrical probe tip 1300. The fourth electrical probe tip 1300 may have a circular shape. The fourth electrical probe tip 1300 may have a base 1302 having a radius $R_{1302}$ of approximately 62.8 µm. The fourth electrical probe tip 1300 may have a first talking point 1304 that is raised above the center of the base 1302 as well as a second taking point 1308 that goes around the periphery of the base 1302. The first talking point 1304 and the second talking point 1308 may contact the micro-solder connections 112 (FIG. 3) on an upper surface 1306 during electrical testing, such as, for example TFI probing. The first talking point 1304 may have a height $H_{1304}$ of approximately 30 µm to approximately 50 µm. The upper surface 1306 of the first talking point 1304 may have a radius $R_{1306}$ of approximately 10 µm to approximately 20 µm. The upper surface 1306 of the second talking point 1308 may have a width $W_{1306}$ of approximately 10 µm to approximately 30 µm. The second talking point 1308 may have an outer sidewall 1310 that is substantially flush with an outside of the base 1302, and an inner sidewall 1312 located between a center of the first talking point 1304 and the outside of the base 1302. The fourth electrical probe tip 1300 may be used to test for power or ground signals in the structure 200 (FIG. 2). The fourth electrical probe tip 1300 may be composed of a conductive material commonly used in conventional electrical probe tips and may be formed using conventional methods of forming electrical probe tips.

Electrical testing may be conducted at various stages of fabrication. More specifically, electrical testing may occur on an individual chip, an entire chip stack, or the final 3D package.

Early detection of errors or faults through electrical testing can save time and money. The advent/used of micro-solder connections in a chip stack presents challenges in testing because the tight pitch of the micro-solder connections may not be compatible with conventional electrical testing techniques, such as, for example TFI probing. This has lead to testing after an entire 3D package is formed, which can be expensive, because if an error or fault is detected, the entire 3D package may have to be replaced. Test interposers may be bonded to individual die in order to test them before assembly of the 3D package, but the process of bonding and de-bonding the test interposer to the die may cause damage to the die.

Embodiments of the present invention may allow for the direct testing, using electrical probes, of micro-solder connections 114 (FIG. 3) without the need for a test interposer. The first pattern 304 (FIG. 3) and the second pattern 306 (FIG. 3) may allow for multiple power/ground micro-solder connections 114 (FIG. 3) on the same domain and multiple signal micro-solder connections 114 (FIG. 3) on the same domain to be contacted through a novel electrical probe tip, described above, that has multiple contact points on an upper surface. This arrangement may allow for the necessary power to be delivered to the wafer for electrical testing and may allow for the use of conventional probing techniques to be used without a silicon interposer.

The terminology used herein is for the purpose of describing particular embodiments only and is not intended to be limiting of the invention. As used herein, the singular forms "a," "an," and "the" are intended to include the plural forms as well, unless the context clearly indicates otherwise. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure, comprising:
an electrical testing probe tip having one or more contact points that are aligned on a same pitch as a pattern of micro-solder connections, the pattern including at least two micro-solder connections in which a distance between a center of a micro-solder connection to a center of an adjacent micro-solder connection is 62 µm, the one or more probe tip contacting points for contacting the pattern of micro-solder connections on a surface of an integrated circuit (IC) chip, the electrical testing probe tip comprising:
a circular base; and
six (6) raised contact points located around the periphery of the circular base, wherein the raised contact points have an outer side aligned with an outer side of the circular base and a width less than a width of the circular base, and wherein the raised contact points are separated by 30 degrees.

2. The structure of claim 1, wherein said raised contact points of the electrical testing probe tip are aligned with the individual micro-solder connections in a pattern of micro-solder connections on a first surface of an integrated circuit IC chip.

* * * * *